(12) United States Patent
Kim et al.

(10) Patent No.: US 8,298,338 B2
(45) Date of Patent: *Oct. 30, 2012

(54) CHEMICAL VAPOR DEPOSITION APPARATUS

(75) Inventors: Changsung Sean Kim, Gyunggi-do (KR); Sang Duk Yoo, Gyunggi-do (KR); Jong Pa Hong, Gyunggi-do (KR); Ji Hye Shim, Gyunggi-do (KR); Won Shin Lee, Seoul (KR)

(73) Assignee: Samsung Electronics Co., Ltd., Seoul (KR)

( * ) Notice: Subject to any disclaimer, the term of this patent is extended or adjusted under 35 U.S.C. 154(b) by 456 days.

This patent is subject to a terminal disclaimer.

(21) Appl. No.: 12/259,709

(22) Filed: Oct. 28, 2008

(65) Prior Publication Data

US 2009/0165713 A1    Jul. 2, 2009

(30) Foreign Application Priority Data

Dec. 26, 2007  (KR) .................. 10-2007-0137715
Sep. 30, 2008  (KR) .................. 10-2008-0096306

(51) Int. Cl.
| | |
|---|---|
| C23C 16/455 | (2006.01) |
| C23F 1/00 | (2006.01) |
| H01L 21/306 | (2006.01) |
| C23C 16/06 | (2006.01) |
| C23C 16/22 | (2006.01) |

(52) U.S. Cl. .................. 118/715; 156/345.33
(58) Field of Classification Search .................. 118/715; 156/345.33

See application file for complete search history.

(56) References Cited

U.S. PATENT DOCUMENTS

| | | | | |
|---|---|---|---|---|
| 3,757,733 | A | * | 9/1973 | Reinberg ................ 118/725 |
| 4,033,287 | A | * | 7/1977 | Alexander et al. ........ 118/723 E |
| 4,307,283 | A | * | 12/1981 | Zajac ..................... 219/121.43 |
| 4,597,986 | A | * | 7/1986 | Scapple et al. ............. 427/582 |
| 4,761,269 | A | * | 8/1988 | Conger et al. ............. 118/679 |
| 4,950,156 | A | * | 8/1990 | Philipossian ............... 432/253 |

(Continued)

FOREIGN PATENT DOCUMENTS

JP          63-140619 U          9/1988

(Continued)

OTHER PUBLICATIONS

Korean Office Action, with English translation, issued in Korean Patent Application No. 10-2008-0096306, mailed Nov. 19, 2010.

(Continued)

*Primary Examiner* — Rudy Zervigon
(74) *Attorney, Agent, or Firm* — McDermott Will & Emery LLP

(57) ABSTRACT

Provided is a chemical vapor deposition apparatus. The apparatus includes a reaction chamber, a gas introduction unit, and a gas exhaust unit. The reaction chamber includes a susceptor on which a wafer is loaded and a reaction furnace in which the wafer is processed by chemical vapor deposition. The gas introduction unit is disposed at an outer wall of the reaction chamber to supply reaction gas from an outside of the reaction furnace to a center portion of the reaction furnace. The gas exhaust unit is disposed at a center portion of the reaction chamber to discharge the reaction gas to an upper or lower outside of the reaction chamber after the reaction gas is used for a reaction in the reaction furnace. Therefore, the gas density inside the chamber can be kept at a substantially uniform state even when process pressure is increased for growing a high-temperature deposition layer.

8 Claims, 7 Drawing Sheets

U.S. PATENT DOCUMENTS

| | | | | |
|---|---|---|---|---|
| 4,976,217 | A * | 12/1990 | Frijlink | 118/733 |
| 5,359,177 | A * | 10/1994 | Taki et al. | 219/121.43 |
| 5,597,439 | A * | 1/1997 | Salzman | 156/345.33 |
| 5,647,912 | A * | 7/1997 | Kaminishizono et al. | 118/719 |
| 5,672,204 | A * | 9/1997 | Habuka | 117/204 |
| 5,686,151 | A | 11/1997 | Imai et al. | |
| 5,708,556 | A * | 1/1998 | van Os et al. | 361/234 |
| 5,746,834 | A * | 5/1998 | Hanley | 118/715 |
| 5,792,272 | A * | 8/1998 | van Os et al. | 118/723 R |
| 5,851,294 | A | 12/1998 | Young et al. | |
| 5,871,586 | A | 2/1999 | Crawley et al. | |
| 5,951,772 | A * | 9/1999 | Matsuse et al. | 118/723 R |
| 5,980,999 | A * | 11/1999 | Goto et al. | 427/572 |
| 6,020,570 | A * | 2/2000 | Taki et al. | 219/121.43 |
| 6,178,918 | B1 | 1/2001 | van Os et al. | |
| 6,190,459 | B1 * | 2/2001 | Takeshita et al. | 118/715 |
| 6,206,976 | B1 * | 3/2001 | Crevasse et al. | 118/720 |
| 6,251,187 | B1 * | 6/2001 | Li et al. | 118/715 |
| 6,325,855 | B1 * | 12/2001 | Sillmon et al. | 118/715 |
| 6,375,750 | B1 | 4/2002 | van Os et al. | |
| 6,428,847 | B1 * | 8/2002 | Grant et al. | 427/248.1 |
| 6,446,572 | B1 | 9/2002 | Brcka | |
| 6,474,257 | B2 * | 11/2002 | Jeng | 118/723 I |
| 6,478,877 | B1 * | 11/2002 | Sillmon et al. | 118/733 |
| 6,497,783 | B1 * | 12/2002 | Suzuki et al. | 156/345.1 |
| 6,592,709 | B1 * | 7/2003 | Lubomirsky | 156/345.48 |
| 6,660,096 | B2 * | 12/2003 | Takeshita et al. | 118/726 |
| 6,666,920 | B1 * | 12/2003 | Sillmon et al. | 118/715 |
| 6,676,758 | B2 * | 1/2004 | Sillmon et al. | 118/715 |
| 6,677,549 | B2 * | 1/2004 | Suzuki et al. | 219/121.41 |
| 6,716,289 | B1 * | 4/2004 | Sillmon et al. | 118/715 |
| 6,755,150 | B2 * | 6/2004 | Lai et al. | 118/723 I |
| 6,808,567 | B2 * | 10/2004 | Takeshita et al. | 118/715 |
| 6,846,364 | B2 * | 1/2005 | Pyo | 118/725 |
| 7,255,772 | B2 * | 8/2007 | Biberger et al. | 156/345.26 |
| 7,390,366 | B2 * | 6/2008 | Shim | 118/715 |
| 7,402,210 | B2 * | 7/2008 | Chen et al. | 118/715 |
| 7,476,291 | B2 * | 1/2009 | Wang et al. | 156/345.33 |
| 7,588,799 | B2 * | 9/2009 | Matsuda et al. | 427/250 |
| 7,722,737 | B2 * | 5/2010 | Gondhalekar et al. | 156/345.33 |
| 7,749,326 | B2 * | 7/2010 | Kim et al. | 118/715 |
| 7,806,078 | B2 * | 10/2010 | Yoshida | 118/723 I |
| 7,846,291 | B2 * | 12/2010 | Otsuki | 156/345.1 |
| 7,887,669 | B2 * | 2/2011 | Satou et al. | 156/345.1 |
| 2001/0000198 | A1 * | 4/2001 | Takeshita et al. | 118/715 |
| 2001/0003271 | A1 * | 6/2001 | Otsuki | 118/723 I |
| 2002/0189543 | A1 * | 12/2002 | Biberger et al. | 118/715 |
| 2002/0195055 | A1 * | 12/2002 | Grant et al. | 118/715 |
| 2003/0084849 | A1 * | 5/2003 | Shim | 118/715 |
| 2003/0089315 | A1 * | 5/2003 | Matsuda et al. | 118/723 AN |
| 2003/0200929 | A1 * | 10/2003 | Otsuki | 118/723 R |
| 2004/0028810 | A1 * | 2/2004 | Grant et al. | 427/248.1 |
| 2004/0045184 | A1 * | 3/2004 | Takeshita et al. | 34/218 |
| 2004/0099378 | A1 * | 5/2004 | Kim et al. | 156/345.33 |
| 2005/0000651 | A1 * | 1/2005 | Biberger et al. | 156/345.1 |
| 2006/0112876 | A1 * | 6/2006 | Choi et al. | 118/715 |
| 2006/0263522 | A1 | 11/2006 | Byun | |
| 2007/0079760 | A1 * | 4/2007 | Okabe et al. | 118/715 |
| 2007/0090032 | A1 * | 4/2007 | Yoshida | 210/150 |
| 2007/0110895 | A1 * | 5/2007 | Rye et al. | 427/240 |
| 2007/0119370 | A1 * | 5/2007 | Ma et al. | 118/723 E |
| 2007/0119371 | A1 * | 5/2007 | Ma et al. | 118/723 E |
| 2007/0128863 | A1 * | 6/2007 | Ma et al. | 438/680 |
| 2008/0069966 | A1 * | 3/2008 | Otsuki | 427/453 |
| 2008/0102203 | A1 * | 5/2008 | Wu et al. | 427/248.1 |
| 2009/0165713 | A1 * | 7/2009 | Kim et al. | 118/719 |
| 2009/0260569 | A1 * | 10/2009 | Kim et al. | 118/715 |
| 2009/0260572 | A1 * | 10/2009 | Kim et al. | 118/730 |
| 2009/0288604 | A1 * | 11/2009 | Kim et al. | 118/726 |
| 2010/0024727 | A1 * | 2/2010 | Kim et al. | 118/715 |

FOREIGN PATENT DOCUMENTS

| | | | |
|---|---|---|---|
| JP | 03-083897 | | 4/1991 |
| JP | 04087323 A | * | 3/1992 |
| JP | 05-217903 | | 8/1993 |
| JP | 5-267182 | | 10/1993 |
| JP | 05267182 A | * | 10/1993 |
| JP | 6-163422 | | 6/1994 |
| JP | 07099162 A | * | 4/1995 |
| JP | 07-235501 | | 9/1995 |
| JP | 10-032169 | | 2/1998 |
| JP | 11-126770 | | 5/1999 |
| JP | 2000-269141 A | | 9/2000 |
| JP | 2000269141 A | * | 9/2000 |
| JP | 2000357600 A | * | 12/2000 |
| JP | 2003-203908 | | 7/2003 |
| JP | 2005-005594 | | 1/2005 |
| JP | 2006-032459 | | 2/2006 |
| JP | 2006-196806 | | 7/2006 |
| KR | 10-230348 B1 | | 8/1999 |
| KR | 0364571 | | 12/2002 |
| KR | 10-703214 B1 | | 3/2007 |

OTHER PUBLICATIONS

Chinese Office Action, w/ English translation thereof, issued in Chinese Patent Application No. CN 200810176342.3 dated Jun. 7, 2010.

United States Office Action issued in U.S. Appl. No. 12/263,781 dated Mar. 2, 2011.

United States Office Action issued in U.S. Appl. No. 12/257,131 dated Mar. 1, 2011.

Korean Office Action, w/ English translation thereof, issued in Korean Patent Application No. KR 10-2008-0036094 dated Mar. 15, 2010.

Chinese Office Action, w/ English translation thereof, issued in Chinese Patent Application No. CN 200810176342.3 dated Mar. 15, 2011.

Japanese Office Action, with English Translation, issued in Japanese Patent Application No. 2008-278378, dated Aug. 2, 2011.

U.S. Office Action issued in U.S. Appl. No. 12/263,781, dated Feb. 16, 2012.

* cited by examiner

CHEMICAL VAPOR DEPOSITION APPARATUS

CROSS-REFERENCE TO RELATED APPLICATIONS

This application claims the priority of Korean Patent Application Nos. 10-2007-0137715, filed on Dec. 26, 2007, and 10-2008-0096306 filed on Sep. 30, 2008, in the Korean Intellectual Property Office, both of which are incorporated herein by reference.

BACKGROUND OF THE INVENTION

1. Field of the Invention

The present invention relates to a chemical vapor deposition apparatus for uniformly and stably growing a deposition layer on a surface of a wafer by supplying reaction gas inwardly.

2. Description of the Related Art

In general, chemical vapor deposition (CVD) is used as an important method for growing various crystal layers on various substrates. CVD is advantageous in growing high-quality crystal layers as compared with a liquid deposition method; however, CVD is disadvantageous due to a relatively low crystal growing rate. To overcome this disadvantage, layers are simultaneously grown on a plurality of substrates during each cycle.

However, in the case where layers are simultaneously grown on a plurality of substrates, the substrates should be kept at the same temperature and exposed to the same flow of reaction gas so as to maintain the quality of layers grown on the substrates uniformly.

Examples of methods that can be used for the above-described purpose includes: a method of creating uniform gas flows along substrates using a plurality of injection tubes; a method of radially arranging a plurality of substrates around a rotation shaft and rotating the whole substrates on the same shaft (orbiting method); and a method of rotating a plurality of substrates individually (individual rotation method). Such methods of the related art may be used together or individually.

SUMMARY OF THE INVENTION

An aspect of the present invention provides a chemical vapor deposition apparatus which allows high-quality vapor deposition by maintaining the gas density inside a chamber at a substantially uniform state and preventing intensive vapor reactions even when the process pressure is increased under process conditions for growing a high-temperature deposition layer.

According to an aspect of the present invention, there is provided a chemical vapor deposition apparatus including: a reaction chamber including a susceptor on which a wafer is loaded and a reaction furnace in which the wafer is processed by chemical vapor deposition; a gas introduction unit disposed at an outer wall of the reaction chamber to supply a reaction gas from an outside of the reaction furnace to a center portion of the reaction furnace; and a gas exhaust unit disposed at a center portion of the reaction chamber to discharge the reaction gas to an upper or lower outside of the reaction chamber after the reaction gas is used for a reaction in the reaction furnace.

The chemical vapor deposition apparatus may further include a flow control unit disposed between the gas introduction unit and the gas exhaust unit so as to make a uniform gas flow from the gas introduction unit to the gas exhaust unit.

The chemical vapor deposition apparatus may further include a driving unit providing rotation power to rotate the susceptor in one direction.

The chemical vapor deposition apparatus may further include a heating unit disposed close to the susceptor for supplying heat to the susceptor.

The flow control unit may include: a barrier wall member disposed at the outside of the reaction furnace to define the reaction furnace in the reaction chamber and introduce the reaction gas supplied from the gas introduction unit to the reaction furnace while adjusting a pressure of the reaction gas; and at least one gas chamber disposed between the outer wall of the reaction chamber and the barrier wall member for storing the reaction gas supplied from the gas introduction unit and supplying the reaction gas through the barrier wall member.

When the gas chamber is provided in plurality, the chemical vapor deposition apparatus may further include at least one dividing member separating the plurality of gas chambers.

The chemical vapor deposition apparatus may further include a vortex preventing unit disposed in the reaction chamber at a side facing the susceptor so as to decrease a distance between the susceptor and the reaction chamber gradually toward the gas introduction unit.

The flow control unit may include: an inclined barrier wall disposed at the outside of the reaction furnace to define the reaction furnace in the reaction chamber and introduce the reaction gas supplied from the gas introduction unit into the reaction furnace while adjusting a pressure of the reaction gas, the inclined barrier wall being inclined at a predetermined angle; and a plurality of gas chambers disposed between the outer wall of the reaction chamber and the inclined barrier wall for storing the reaction gas supplied from the gas introduction unit and supplying the reaction gas through the inclined barrier wall; and at least one dividing member separating the gas chambers.

The chemical vapor deposition apparatus may further include a vortex preventing unit disposed in the reaction chamber at a side facing the susceptor so as to decrease a distance between the susceptor and the reaction chamber gradually toward the gas introduction unit.

The flow control unit may include: a plurality of gas chambers disposed in the reaction chamber; at least one dividing member separating the gas chambers so that the gas chambers have different lengths and are stepped; and dividing barrier walls disposed at end portions of the gas chambers to introduce the reaction gas supplied from the gas introduction unit into the reaction furnace while adjusting a pressure of the reaction gas, wherein the gas chambers are disposed between the outer wall of the reaction chamber and the dividing barrier walls for storing the reaction gas supplied from the gas introduction unit and supplying the reaction gas through the dividing barrier walls.

The chemical vapor deposition apparatus may further include a vortex preventing unit disposed in the reaction chamber at a side facing the susceptor so as to decrease a distance between the susceptor and the reaction chamber gradually toward the gas introduction unit.

The chemical vapor deposition apparatus may further include a plurality of parallel guide members disposed at the dividing barrier walls in a substantially horizontal direction for guiding a flow of the reaction gas.

The gas introduction unit may include a plurality of gas supply lines communicating with the gas chambers for supplying different gases to the gas chambers.

The driving unit may include: a driven gear formed at an outer surface of the susceptor; a driving gear engaged with the driven gear; and a rotary motor disposed at an end of a drive shaft rotating the driving gear for providing rotation power.

The chemical vapor deposition apparatus may further include a shaft disposed at a center portion of the susceptor for rotating the susceptor, the shaft including the gas exhausting unit therein, wherein the driving unit includes: a driven gear disposed at the susceptor; a driving gear engaged with the driven gear; and a rotary motor disposed at an end of a drive shaft rotating the driving gear.

The gas exhaust unit may include: an exhaust hole formed at an inner top portion of the reaction chamber or a center portion of the susceptor; and an exhaust line communicating with the exhaust hole.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

The chemical vapor deposition apparatus of the present invention is applicable to any chemical vapor deposition apparatus used to deposit a thin layer (film) on an object such as a wafer using a chemical reaction.

Figure 1:
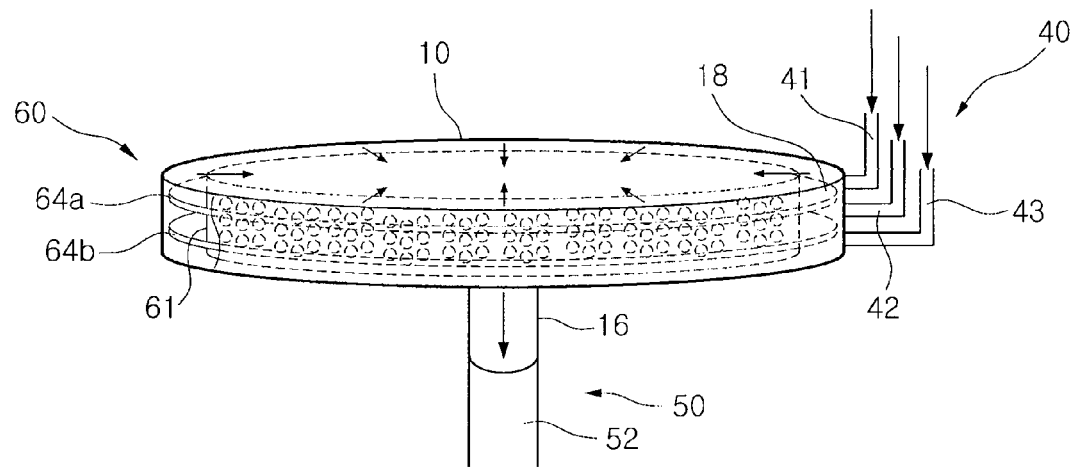
FIG. 1 is a schematic view illustrating a chemical vapor deposition apparatus according to an embodiment of the present invention.
Figure 2:
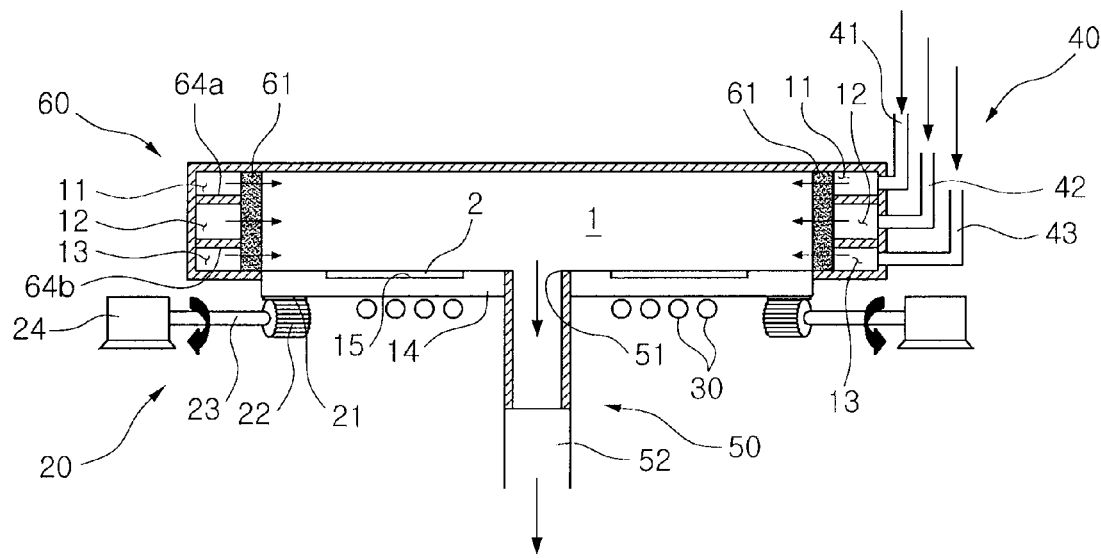
FIG. 2 is a side sectional view illustrating the chemical vapor deposition apparatus of FIG. 1.

FIG. 1 is a perspective view illustrating a chemical vapor deposition apparatus according to an embodiment of the present invention, and FIG. 2 is a side sectional view illustrating the chemical vapor deposition apparatus of FIG. 1.

As shown in FIGS. 1 and 2, the chemical vapor deposition apparatus of the current embodiment includes a reaction chamber 10, a driving unit 20, a heating unit 30, a gas introducing unit 40, a gas exhaust unit 50, and a flow control unit 60.

The reaction chamber 10 includes an inner space having a predetermined size as a reaction furnace 1 in which a chemical vapor reaction occurs between introduced reaction gas and a deposition object such as a wafer, and an insulating material may be disposed inside the reaction furnace 1 for protecting the reaction furnace 1 from a hot atmosphere.

A susceptor 14, in which a plurality of pockets 15 are formed for receiving a plurality of wafers 2, is disposed at the inside of the reaction chamber 10. That is, the susceptor 14 is disposed at the reaction furnace 1.

As shown in FIG. 2, the susceptor 14 has an outer diameter smaller than that of the reaction chamber 10. The susceptor 14 is formed of a material such as graphite and has a disk shape. A shaft 16 coupled to a center portion of the reaction chamber 10 may be formed of a hollow pipe member having an exhaust hole 51. The exhaust hole 51 forms a gas exhaust passage.

The driving unit 20 provides rotation power so that the susceptor 14 on which a plurality of wafers 2 is loaded can be constantly rotated in one direction.

As shown in FIG. 2, the driving unit 20 includes a driven gear 21 at an outer bottom surface of the susceptor 14 as an integral part or a separate structure, and a driving gear 22 engaged with the driven gear 21. The driving gear 22 is coupled to an end of a drive shaft 23 of a rotary motor 24, which generates a rotation force in response to applied power.

Figure 4:
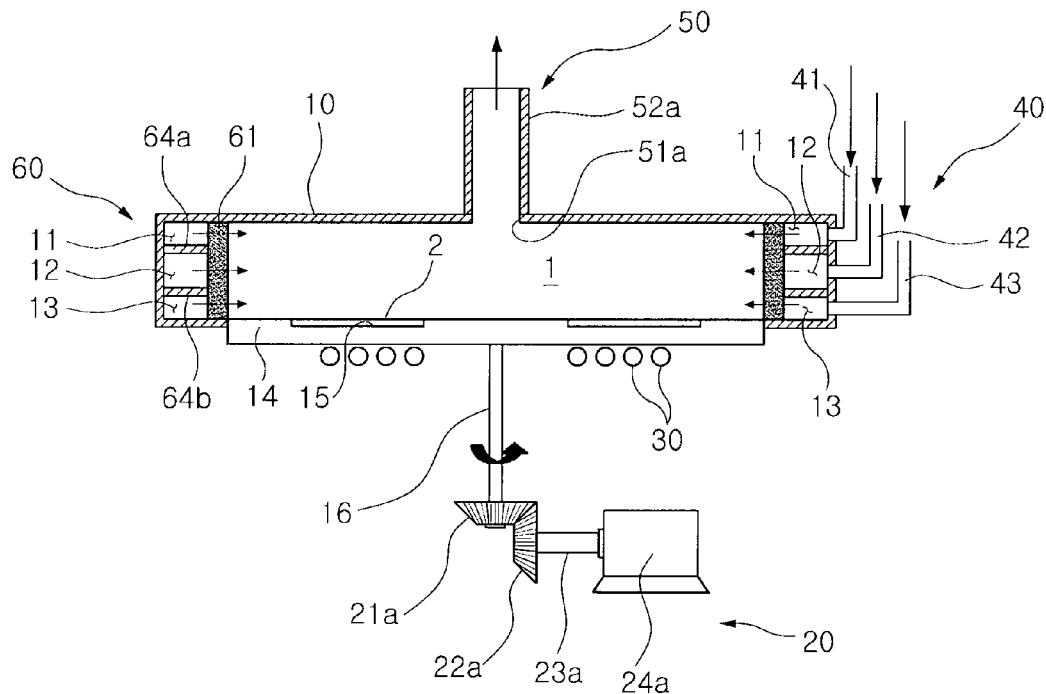
FIG. 4 is a side sectional view illustrating the chemical vapor deposition apparatus of FIG. 3.

In another embodiment shown in FIG. 4, the driving unit 20 may include a driven gear 21a coupled to a shaft 16 as an integral part or a separate structure, and a driving gear 22a engaged with the driven gear 21a. The shaft 16 may extend downward from the bottom of the susceptor 14 in a vertical direction. The driving gear 22a may be coupled to an end of a drive shaft 23a of a rotary motor 24a, which generates a rotation force in response to applied power.

Owing to this structure, when the rotary motor 24 or 24a is operated, the susceptor 14 on which wafers 2 are loaded can be rotated in one direction at a constant speed of about 5 rpm to about 50 rpm by the engaged driving and driving gears 22 (22b) and 21 (21a).

The heating unit 30 is disposed close to the bottom of the heating element 14 on which wafers 2 are loaded to radiate heat toward the susceptor 14 for indirectly heating the wafers 2.

The heating unit 30 may be one of an electric heater, a high-frequency induction heater, an infrared radiation heater, and a laser heater.

A temperature sensor (not shown) may be disposed inside the reaction chamber 10 at a position close to the outer surface of the susceptor 14 or the heating unit 30 to detect a temperature inside the reaction chamber 10 for adjusting a heating temperature.

The gas introducing unit 40 is disposed at an outer wall 18 of the reaction chamber 10 to supply gas to the reaction chamber 10 for generating a gas flow from the outside of the reaction chamber 10 toward the inner center of the reaction chamber 10.

The gas introducing unit 40 includes first to third gas introduction units 41, 42, and 43 for supplying different gases. For example, a first reaction gas may be supplied through the first gas introduction unit 41, and a second reaction gas may be supplied through the second and third introduction units 42 and 43.

The first and second reaction gases may be different or have a common component. Alternatively, the same gas may be supplied through the first to third gas introduction units 41, 42, and 43, or three kinds of gases may be supplied through the first to third gas introduction units 41, 42, and 43, respectively. The kinds of reaction gases may vary according to a deposition layer to be formed on an object.

The gas exhaust unit 50 is disposed at a center portion of the reaction chamber 10 to discharge gas (waste gas) to the upper or lower outside of the reaction chamber 10 after the gas is used for growing layers on the surfaces of the wafers 2 while being supplied from the outside to the inner center of the reaction furnace 1.

As shown in FIGS. 1 and 2, the gas exhaust unit 50 is configured to exhaust reaction gas through a bottom center portion of the reaction chamber 10. For this, the gas exhaust unit 50 may include the exhaust hole 51 formed in the shaft 16 coupled to the rotation center of the susceptor 14, and an exhaust line 52 disposed at a lower end of the exhaust hole 51.

Figure 3:
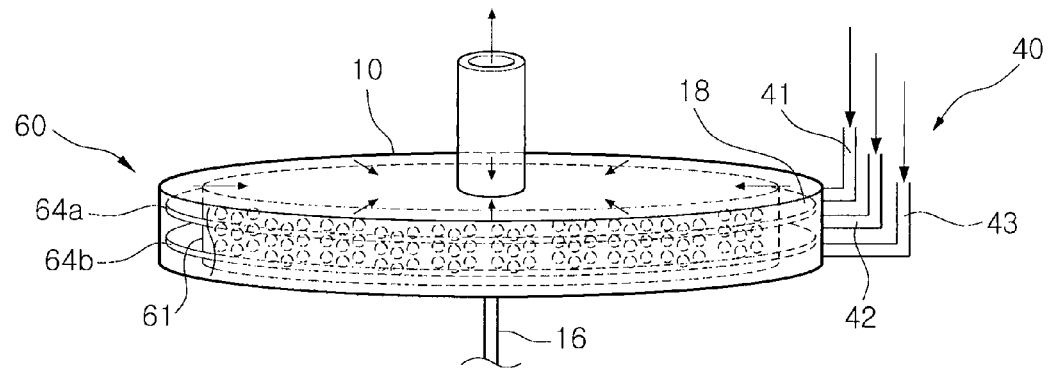
FIG. 3 is a schematic view illustrating a chemical vapor deposition apparatus according to another embodiment of the present invention.

In another embodiment shown in FIGS. 3 and 4, the gas exhaust unit 50 may include an exhaust hole 51a formed through a top center portion of the reaction chamber 10, and an exhaust line 52a connected to the exhaust hole 51a.

Therefore, while reaction gas supplied from the outside of the reaction furnace 1 (that is, supplied through the outer wall 18) flows toward the center of the reaction chamber 10, the reaction gas reacts with an upper surface (deposition surface) of a wafer 2 for growing a lower on the surface of the wafer 2. Thereafter, the reaction gas (waste gas) is discharged to the lower outside of the reaction chamber 10 through the exhaust hole 51 of the shaft 16 disposed at the bottom side of the susceptor 14 or to the upper outside of the reaction chamber 10 through the exhaust hole 51a disposed at the top side of the reaction chamber 10.

The flow control unit 60 is used to generate a uniform gas flow from the gas introducing unit 40 to the gas exhaust unit 50. As shown in FIG. 2 and FIG. 4, the flow control unit 60 includes a gas chamber and a barrier wall member 61.

The gas chamber has a predetermined size and is formed between the outer wall 18 of the reaction chamber 10 and the barrier wall member 61. The gas chamber communicates with the gas introducing unit 40 to store reaction gas temporarily and supply the reaction gas to the reaction furnace 1 through the barrier wall member 61.

One gas chamber may be provided, or a plurality of gas chambers may be provided as shown in FIGS. 2 and 4.

As shown in FIGS. 2 and 4, the chemical vapor deposition apparatus may include a first gas chamber 11, a second gas chamber 12, and a third gas chamber 13, which communicate with the first gas introduction unit 41, the second gas introduction unit 42, and the third gas introduction unit 43, respectively.

The barrier wall member 61 is vertically disposed and spaced a predetermined distance from the outer wall 18 (outermost side) of the reaction chamber 10 toward the center of the reaction chamber 10. For this, the barrier wall member 61 is configured by a cylindrical member continuously disposed along the circumference of the outer wall 18 of the reaction chamber 10 at a predetermined distance away from the outer wall 18.

The barrier wall member 61 may be formed of a porous body through which reaction gas supplied from the gas introducing unit 40 can flow freely.

The plurality of gas chambers 11, 12, and 13 may be separated by dividing members 64a and 64b.

Figure 5:
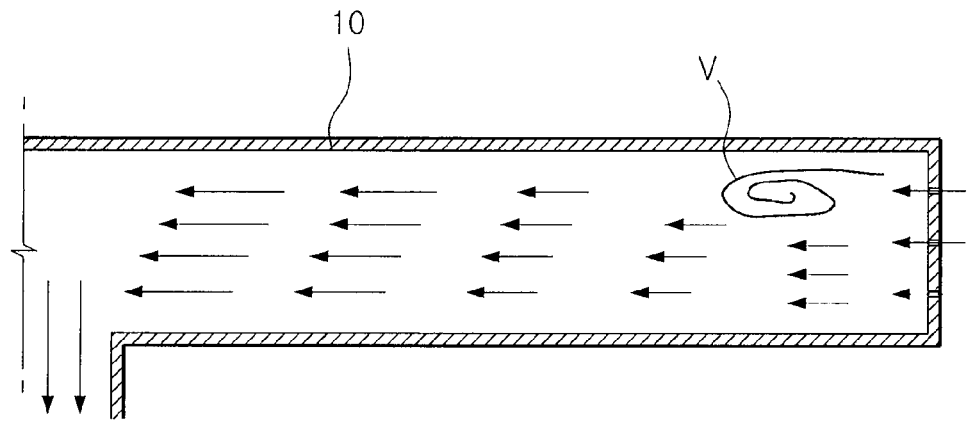
FIG. 5 is a schematic view illustrating a vortex that can be generated in a reaction chamber of a chemical vapor deposition apparatus of the present invention.

When reaction gas flows from the outside to the inner center of the reaction chamber 10, as shown in FIG. 5, a non-uniform gas flow can be observed at an peripheral side of the reaction chamber 10 through which the reaction gas is introduced.

This may be caused by thermal convection between the top surface of the susceptor 14 and the ceiling of the reaction chamber 10 when the susceptor 14 is loaded with wafers 2 and heated to a high temperature by the heating unit 30.

Due to the thermal convection, the flow of reaction gas receive an upward buoyant force, and thus the velocity of the reaction gas flow increases gradually from the outside to the center of the reaction chamber 10. That is, the velocity of the reaction gas is lower at the peripheral side of the reaction chamber 10 than at the center of the reaction chamber 10, and thus a non-uniform gas flow such as a vortex is generated to cause an unstable reaction on the deposition surface of a wafer 2 and unstable layer growing on the wafer 2.

Figure 6:
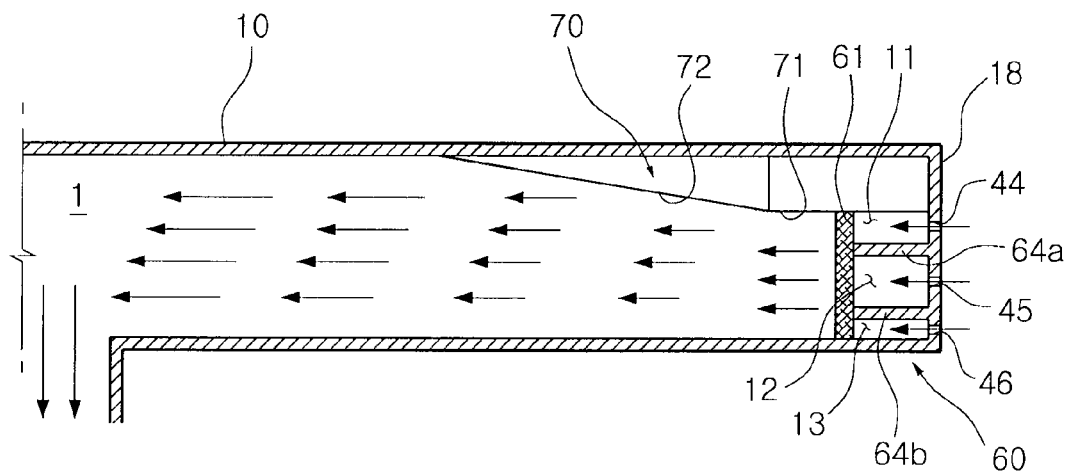
FIG. 6 is a view illustrating a flow control unit and a vortex preventing unit included in a chemical vapor deposition apparatus according to an embodiment of the present invention.
Figure 7:
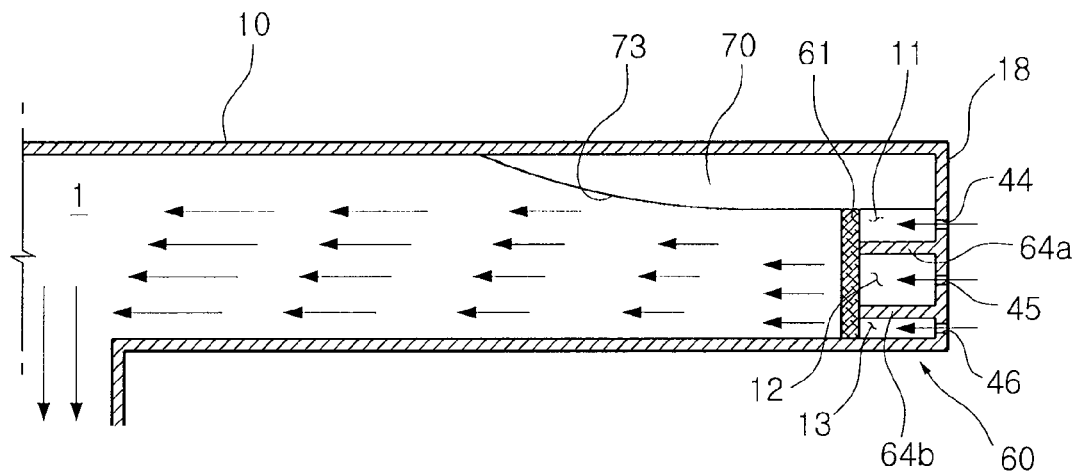
FIG. 7 is a view illustrating a flow control unit and a vortex preventing unit included in a chemical vapor deposition apparatus according to another embodiment of the present invention.

Therefore, to minimize generation of a vortex or ultimately remove the possibility of a vortex, a vortex preventing unit 70 may be disposed in the reaction chamber 10 at a surface facing the susceptor 14 in a manner such that the distance between the susceptor 14 and the reaction chamber 10 decreases gradually toward the gas introducing unit 40 as shown in FIGS. 6 and 7.

The vortex preventing unit 70 may be formed by protruding the inner ceiling of the reaction chamber 10 toward the susceptor 14, or by detachably attaching a material having a low thermal conductivity such as quartz to the inner ceiling of the reaction chamber 10.

As shown in FIG. 6, the outer surface of the vortex preventing unit 70 facing the susceptor 14 may include a horizontal surface 71 that is parallel with the top surface of the susceptor 14 and an inclined surface 72 that makes a predetermined angle with the top surface of the susceptor 14. In another embodiment shown in FIG. 7, the vortex preventing unit 70 may include a curved surface 73 having a predetermined curvature.

In FIGS. 6 and 7, reference numeral 44 denotes a gas introduction hole of the first gas introduction unit 41 (refer to FIG. 1); reference numeral 45 denotes a gas introduction hole of the second gas introduction unit 42 (refer to FIG. 1); and reference numeral 46 denotes a gas introduction hole of the third gas introduction unit 43 (refer to FIG. 1)

The gas introduction holes 44, 45, and 46 are applied, in the same way, to the embodiments shown in FIGS. 8 to 11.

Figure 8:
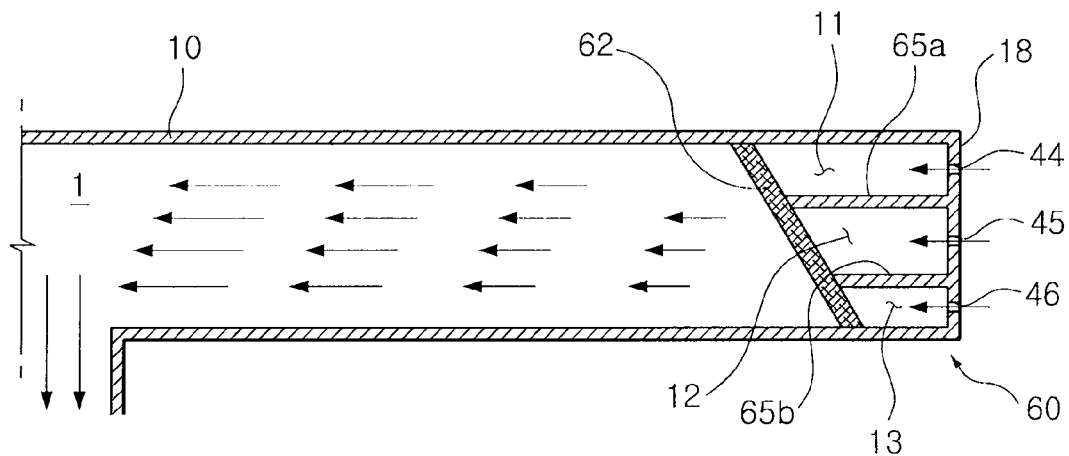
FIG. 8 is a view illustrating a flow control unit included in a chemical vapor deposition apparatus according to another embodiment of the present invention.
Figure 9:
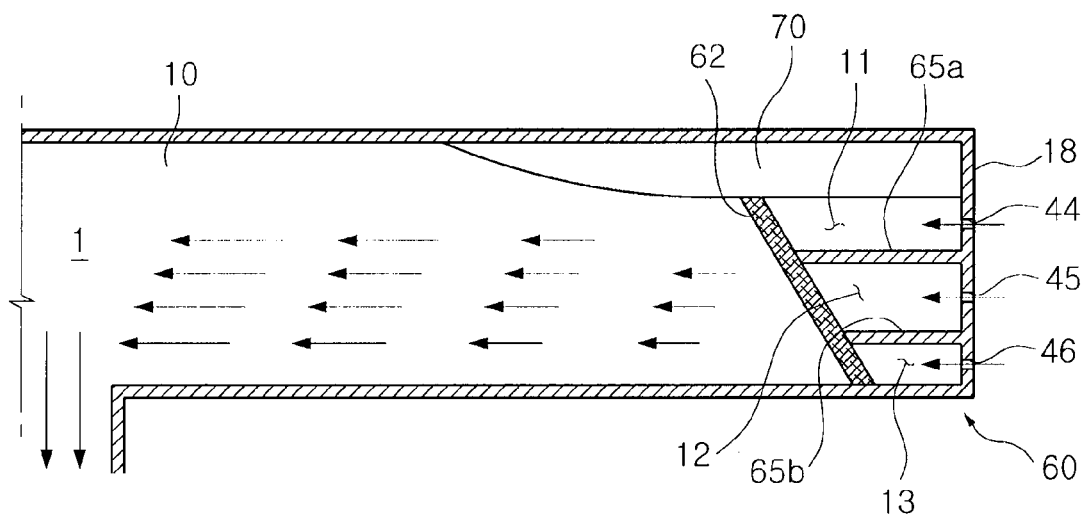
FIG. 9 is a view illustrating a chemical vapor deposition apparatus including the vortex preventing unit of FIG. 7 and the flow control unit of FIG. 8.

As shown in FIGS. 8 and 9, the flow control unit 60 may include an inclined barrier wall 62 sloped at a predetermined angle, and dividing members 65a and 65b configured to divide a gas chamber defined between the inclined barrier wall 62 and the outer wall 18 into first to third gas chambers 11, 12, and 13. In this way, the flow control unit 60 may have an inclined structure.

The inclined barrier wall 62 is sloped and spaced a predetermined distance from the outer wall 18 of the reaction chamber 10 toward the center of the reaction chamber 10. For this, the inclined barrier wall 62 may be configured by a cylindrical member continuously disposed along the circumference of the outer wall 18 of the reaction chamber 10 at a predetermined distance away from the outer wall 18.

Like the barrier wall member 61, the inclined barrier wall 62 may be formed of a porous body through which reaction gas supplied from the gas introducing unit 40 can flow freely.

Owing to the flow control unit 60 including the inclined barrier wall 62 and the diving members 65a and 65b, an upper gas chamber (for example, the gas chamber 11) is longer than a lower gas chamber (for example, the gas chamber 13). Therefore, in the reaction furnace 1, cold reaction gas can flow further at the upper side than at the lower side of the reaction furnace 1, and thus, thermal convection can be suppressed and flows of gas can be stabilized and maintained uniformly.

FIG. 9 illustrates a chemical vapor deposition apparatus that includes: the inclined barrier wall 62, the dividing members 65a and 65b, and the gas chambers 11, 12, and 13 that are shown in FIG. 8; and the vortex preventing unit 70 shown in FIG. 7, according to an embodiment of the present invention.

By combining the flow control unit 60 and the vortex preventing unit 70 in this way, reaction gas can flow more uniformly in the reaction chamber 1.

Figure 10:
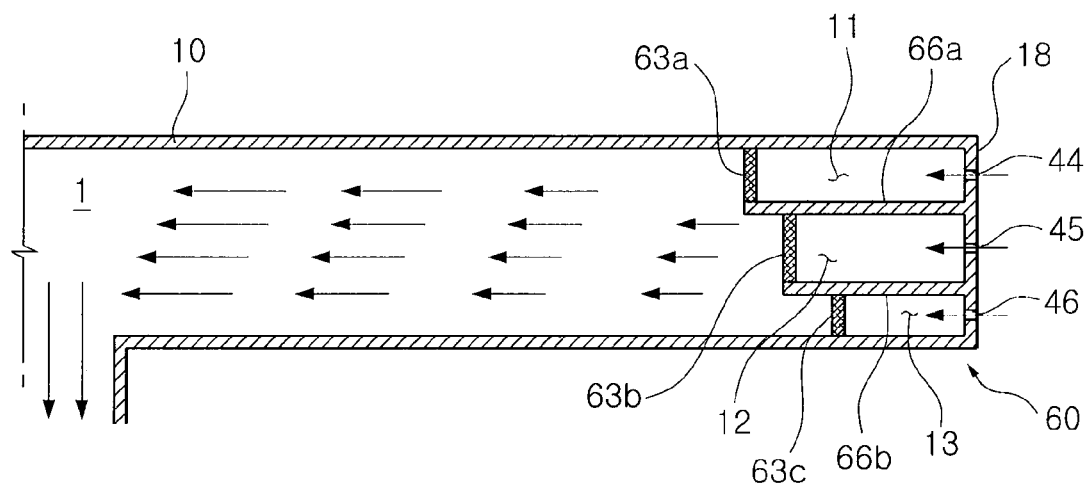
FIG. 10 is a view illustrating a flow control unit included in a chemical vapor deposition apparatus according to still another embodiment of the present invention.
Figure 11:
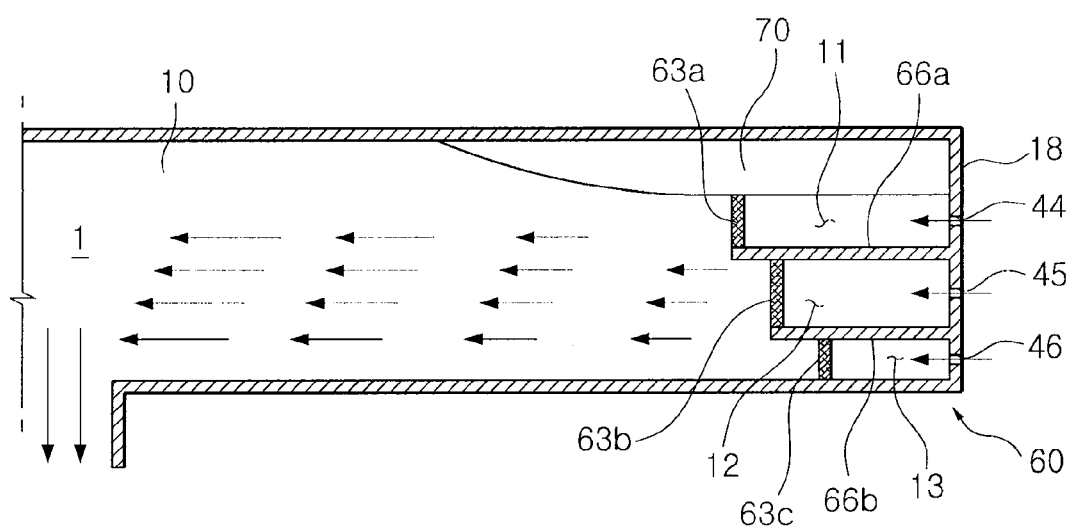
FIG. 11 is a view illustrating a chemical vapor deposition apparatus including the vortex preventing unit of FIG. 7 and the flow control unit of FIG. 10.

In another embodiment shown in FIGS. 10 and 11, a plurality of gas chambers 11, 12, and 13 may be formed at an peripheral side of the reaction furnace 1 in an stepped manner, and dividing barrier walls 63a, 63b, and 63c may be disposed at ends of the gas chambers 11, 12, and 13 so as to form a multi-stepped flow control unit 60.

In other words, the flow control unit 60 of the chemical vapor deposition apparatus of FIG. 10 includes a first gas chamber 11, a second gas chamber 12 that is shorter than the first gas chamber 11 and recessed from the first gas chamber 11, and a third gas chamber 13 that is shorter than the second gas chamber 12 and recessed from the second gas chamber 12.

In addition, a first dividing barrier wall 63a is disposed at an end of the first gas chamber 11 facing the inside of the reaction furnace 1, a second dividing barrier wall 63b is disposed at an end of the second gas chamber 12 facing the inside of the reaction furnace 1, and a third dividing barrier wall 63c is disposed at an end of the third gas chamber 13 facing the inside of the reaction furnace 1.

The gas chambers 11, 12, and 13 are separated by dividing members 66a and 66b.

Owing to the above-described multi-stepped structure of the flow control unit 60, an upper gas chamber (for example, the gas chamber 11) is longer than a lower gas chamber (for example, the gas chamber 13). Therefore, in the reaction furnace 1, cold reaction gas can flow further at the upper side than at the lower side of the reaction furnace 1, and thus, thermal convection can be suppressed and flows of gas can be stabilized and maintained uniformly.

FIG. 11 illustrates a chemical vapor deposition apparatus that includes: the dividing barrier walls 63a, 63b, and 63c, the dividing members 66a and 66b, and the gas chambers 11, 12, and 13 that are shown in FIG. 10; and the vortex preventing unit 70 shown in FIG. 7, according to an embodiment of the present invention.

By combining the flow control unit 60 and the vortex preventing unit 70 in this way, reaction gas can flow more uniformly in the reaction chamber 1.

Figure 12:
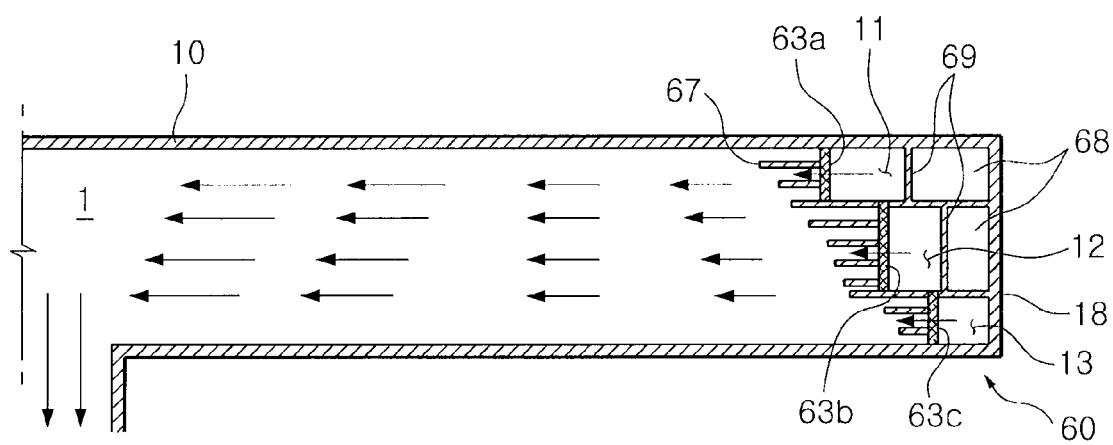
FIG. 12 is a view illustrating guide members and circulation lines added to the flow control unit of FIG. 10, according to an embodiment of the present invention.

FIG. 12 illustrates guide members and circulation lines added to the flow control unit of FIG. 10, according to an embodiment of the present invention.

Referring to FIG. 12, a plurality of guide members 67 may be respectively disposed at the dividing barrier walls 63a, 63b, and 63c in a gas flow direction to guide flows of gas toward the inside of the reaction furnace 1.

Since the guide members 67 guide flows of gas by a predetermined length, the gas flows can be uniform. As it goes downward, the length of the guide members 67 may be decreased.

As shown in FIG. 12, circulation lines 68 may be provided at outer sides of the gas chambers 11, 12, and 13 to allow flows of coolant along the outer wall 18 of the reaction chamber 10 for cooling the reaction chamber 10.

Figure 13A:
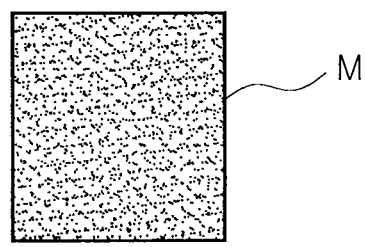
FIGS. 13A to 13E are views illustrating examples of barrier walls of a chemical vapor deposition apparatus according to embodiments of the present invention.

The barrier wall member 61, the inclined barrier wall 62, and the dividing barrier walls 63a, 63b, and 63c (hereinafter, referred to as barrier walls) are porous so that reaction gas can freely flow through the barrier walls. The barrier walls may be formed of a porous medium M having a plurality of fine holes as shown in FIG. 13A.

Figure 13B:
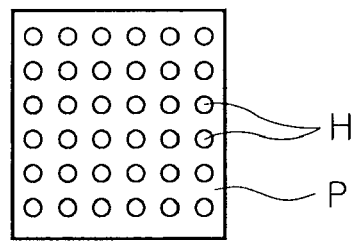

Alternatively, as showing in FIG. 13B, the barrier walls may be formed of a plate P through which a plurality of holes H having the same inner diameter or different inner diameters are formed for allowing free flows of reaction gas therethrough.

Figure 13C:
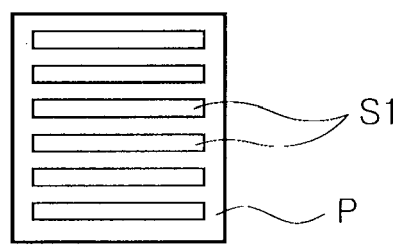
Figure 13D:
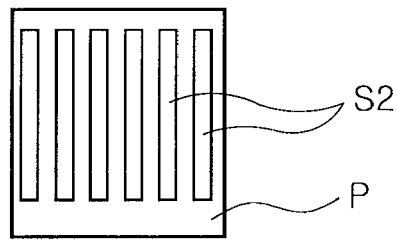

Alternatively, as showing in FIGS. 13C and 13D, the barrier walls may be formed of a plate P through which a plurality of horizontal slits S1 or vertical slits S2 are formed for allowing free flows of reaction gas therethrough.

Figure 13E:
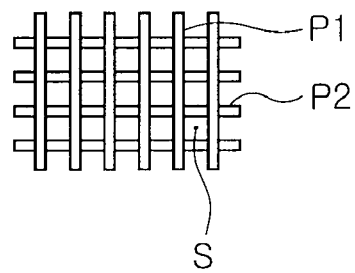

Alternatively, as showing in FIG. 13E, the barrier walls may be formed of vertical rods P1 and horizontal rods P2 crossing the vertical rods P1 at a right or predetermined angle with spaces S having a predetermined size being defined therebetween.

According to an embodiment of the present invention, deposition can be performed in the chemical vapor deposition apparatus as follows. Depositions objects such as wafers 2 are loaded in the pockets 15 of the susceptor 14 disposed at the reaction chamber 10.

After the wafers 2 are loaded, power is supplied to the heating unit 30 disposed close to the susceptor 14, and then the heating unit 30 radiates heat toward the susceptor 14 so that the wafers 2 are heated to a temperature of about 700° C. to about 1200° C. and the inside of the reaction chamber 10 is kept at a high-temperature state.

Referring to FIG. 2, the rotary motor 24 is operated to rotate the driving gear 22 engaged with the driven gear 21 formed at the susceptor 14. Alternatively, as shown in FIG. 4, the rotary motor 24a is operated to rotate the driving gear 22a engaged with the driven gear 21a provided at the shaft 16 of the susceptor 14. In this way, the susceptor 14 is rotated in one direction.

In this state, reaction gas is supplied through the gas introducing unit 40 connected to the outer wall 18 of the reaction chamber 10. As shown in FIGS. 1 to 4, the supplied reaction gas temporarily stays at the gas chambers 11, 12, and 13 defined between the outer wall 18 of the reaction chamber 10 and the flow control unit 60 spaced a predetermined apart from the outer wall 18. Then, the reaction gas flows to the inside of the reaction chamber 10 through the barrier wall member 61 formed of a porous body in the form of a laminar flow.

That is, as the flow of the reaction gas passes through the flow control unit 60, the flow of the reaction gas become laminar so that a laminar flow of reaction gas can be formed in a direction from the outside to the center of the reaction chamber 10.

At this time, the reaction gas supplied from the outside of the reaction chamber 10 can receive a upward buoyant force caused by thermal convection between the top surface of the susceptor 14 heated to a high temperature and the ceiling of the reaction chamber 10, and thus, the flow of the reaction gas can become unstable.

To prevent this, as shown in FIGS. 6 and 7, the chemical vapor deposition apparatus of the present invention includes the vortex preventing unit 70 between the barrier wall member 61 and the ceiling of the reaction chamber 10 to reduce the distance between the susceptor 14 and the reaction chamber 10 gradually toward the gas introducing unit 40, so that the flow of the reaction gas can be stabilized and uniformly kept.

As shown in FIGS. 8 and 9, the flow control unit 60 may have an inclined shape, or as shown in FIGS. 10 and 11, the flow control unit 60 may have a multi-stepped shape, so as to allow cold air to move further at the upper inner side of the reaction furnace 1 than the lower inner side of the reaction furnace 1. In this case, thermal convection can be suppressed, and the flow of the reaction gas can be stabilized and uniformly kept.

The reaction gas, supplied to the center portion of the reaction chamber 10 through the flow control unit 60 disposed at the peripheral side of the reaction chamber 10, reacts with the top surfaces (deposition surfaces) of the wafers 2 for uniformly growing layers on the top surfaces of the wafers 2 by chemical deposition. Thereafter, the reaction gas (waste gas) is discharged, together with byproducts, to the outside of the reaction chamber 10 from the center portion of the reaction chamber 10 through the upper or lower side of the reaction chamber 10.

That is, in the case where the shaft 16 disposed at the bottom side of the susceptor 14 is formed of a hollow pipe having an exhaust hole 51 connected to an exhaust line 52 as shown in FIGS. 1 and 2, the waste gas is discharged from the center portion of the reaction chamber 10 to the lower outside of the reaction chamber 10 through the exhaust hole 51 and the exhaust line 52.

Alternatively, in the case where an exhaust hole 51a is formed in a top center portion of the reaction chamber 10 and is connected to an exhaust line 52a as shown in FIGS. 3 and 4, the waste gas is smoothly discharged, by strong thermal convection caused by the susceptor 14 heated to a high temperature, from the center portion of the reaction chamber 10 to the upper outside of the reaction chamber 10 through the exhaust hole Sa and the exhaust line 52a.

According to the chemical vapor deposition apparatus of the present invention, the gas intensity inside the chamber can be kept at a substantially uniform state even when the process pressure is increased under process conditions for growing a high-temperature deposition layer.

In addition, reaction gas supplied to a peripheral side of the reaction chamber through the gas introduction unit connected to the outside of the reaction chamber is temporarily stored in the flow control unit and then supplied to the center portion of the reaction chamber, so as to prevent or minimize generation of a vortex in the vicinity of the gas introduction unit caused by thermal convection at the surface of the susceptor heated to a high temperature. Furthermore, waste gas can be discharged from the reaction chamber to the upper or lower outside of the reaction chamber. Therefore, the uniformity of gas flow can be improved, and intensive vapor reactions can be prevented inside the reaction chamber. Thus, high-quality deposition wafers on which layers are uniformly grown can be manufactured.

While the present invention has been shown and described in connection with the exemplary embodiments, it will be apparent to those skilled in the art that modifications and variations can be made without departing from the spirit and scope of the invention as defined by the appended claims.

What is claimed is:

1. A chemical vapor deposition apparatus comprising: a reaction chamber comprising a susceptor on which a wafer is loaded and a reaction furnace in which the wafer is processed by chemical vapor deposition; a gas introduction unit disposed at an outer wall of the reaction chamber to supply a reaction gas from an outside of the reaction furnace to a center portion of the reaction furnace; a gas exhaust unit disposed at a center portion of the reaction chamber to discharge the reaction gas to an upper or lower outside of the reaction chamber after the reaction gas is used for a reaction in the reaction furnace; a flow control unit disposed between the gas introduction unit and the gas exhaust unit so as to make a uniform gas flow from the gas introduction unit to the gas exhaust unit, wherein the flow control unit comprises: a barrier wall disposed at the outside of the reaction furnace to define the reaction furnace in the reaction chamber and introduce the reaction gas supplied from the gas introduction unit into the reaction furnace while adjusting a pressure of the reaction gas; a plurality of gas chambers disposed between the outer wall of the reaction chamber and the barrier wall for storing the reaction gas supplied from the gas introduction unit and supplying the reaction gas through the barrier wall; and at least one dividing member separating the gas chambers, a vortex preventing unit disposed in the reaction chamber on an upper surface thereof, having a surface disposed above the susceptor and facing the susceptor, in a manner such that a distance between the susceptor and the upper surface of the reaction chamber gradually decreases toward the gas introduction unit so as to prevent a vortex from being generated in the reaction chamber.

2. The chemical vapor deposition apparatus of claim 1, further comprising a driving unit providing rotation power to rotate the susceptor in one direction.

3. The chemical vapor deposition apparatus of claim 1, further comprising a heating unit disposed close to the susceptor for supplying heat to the susceptor.

4. The chemical vapor deposition apparatus of claim 1, wherein the gas introduction unit comprises a plurality of gas supply lines communicating with the gas chambers for supplying different gases to the gas chambers.

5. The chemical vapor deposition apparatus of claim 2, wherein the driving unit comprises:
 a driven gear formed at an outer surface of the susceptor;
 a driving gear engaged with the driven gear; and
 a rotary motor disposed at an end of a drive shaft rotating the driving gear for providing rotation power.

6. The chemical vapor deposition apparatus of claim 2, further comprising a shaft disposed at a center portion of the susceptor for rotating the susceptor, the shaft comprising the gas exhausting unit therein,
 wherein the driving unit comprises:
 a driven gear disposed at the susceptor;
 a driving gear engaged with the driven gear; and
 a rotary motor disposed at an end of a drive shaft rotating the driving gear.

7. The chemical vapor deposition apparatus of claim 1, wherein the gas exhaust unit comprises:
 an exhaust hole formed at an inner top portion of the reaction chamber or a center portion of the susceptor; and
 an exhaust line communicating with the exhaust hole.

8. The chemical vapor deposition apparatus of claim 1, wherein the barrier wall is inclined at a predetermined angle.

* * * * *